(12) United States Patent
Hirano et al.

(10) Patent No.: US 7,893,534 B2
(45) Date of Patent: Feb. 22, 2011

(54) THERMALLY INSULATING BONDING PAD STRUCTURE FOR SOLDER REFLOW CONNECTION

(75) Inventors: Toshiki Hirano, San Jose, CA (US); Haruhide Takahashi, Kanagawa (JP); Tatsumi Tsuchiya, Ayase (JP)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 77 days.

(21) Appl. No.: 11/891,530

(22) Filed: Aug. 10, 2007

(65) Prior Publication Data

US 2009/0039505 A1    Feb. 12, 2009

(51) Int. Cl.
*H01L 23/48* (2006.01)

(52) U.S. Cl. .......... 257/737; 257/778; 257/E23.02; 257/E23.019; 29/603.03; 29/603.04; 29/603.05; 29/603.06; 29/603.07

(58) Field of Classification Search .......... 360/294.3; 29/603.03–603.12; 257/737, 778, E23.02, 257/E23.019
See application file for complete search history.

(56) References Cited

U.S. PATENT DOCUMENTS

| | | | |
|---|---|---|---|
| 5,828,031 A | 10/1998 | Pattanaik | |
| 5,982,585 A | 11/1999 | Fan et al. | |
| 6,046,882 A | 4/2000 | Pattanaik et al. | |
| 6,459,549 B1 | 10/2002 | Tsuchiya et al. | |
| 6,501,623 B1 | 12/2002 | Sassolini et al. | |
| 6,523,250 B2 | 2/2003 | Erpelding et al. | |
| 6,574,077 B1 * | 6/2003 | Crane et al. ............ | 360/294.3 |
| 6,665,151 B1 | 12/2003 | Bonin et al. | |
| 6,757,135 B2 | 6/2004 | Rancour et al. | |
| 6,774,495 B2 | 8/2004 | Kim | |
| 6,833,978 B2 | 12/2004 | Shum et al. | |
| 6,897,141 B2 | 5/2005 | Kim | |
| 6,927,946 B2 | 8/2005 | Shum et al. | |
| 6,992,864 B2 | 1/2006 | Kaneko et al. | |
| 7,009,799 B2 | 3/2006 | Sassolini et al. | |
| 7,159,300 B2 * | 1/2007 | Yao et al. ............ | 29/603.03 |
| 7,287,312 B2 * | 10/2007 | Yamaguchi ............ | 29/603.04 |
| 2003/0196315 A1 * | 10/2003 | Yao et al. ............ | 29/603.06 |
| 2004/0070888 A1 | 4/2004 | Mastromatteo et al. | |
| 2006/0164763 A1 | 7/2006 | Yao et al. | |

(Continued)

FOREIGN PATENT DOCUMENTS

EP         1635624         3/2006

(Continued)

OTHER PUBLICATIONS

Dictionary.com, definition of "hollow", Dec. 17, 2008, http://dictionary.reference.com/browse/hollow.*

(Continued)

*Primary Examiner*—N Drew Richards
*Assistant Examiner*—Yu-Hsi Sun

(57) ABSTRACT

A thermally insulating bonding pad for solder reflow is described. The bonding pad includes a structure. The structure forms the bonding pad. The bonding pad further includes an insulator formed on the structure. The insulator is configured to be interposed between the structure and a substrate of a component onto which said bonding pad is to be disposed. The bonding pad provides thermal insulation for said substrate when said bonding pad is subject to a solder reflow process being performed thereon.

20 Claims, 23 Drawing Sheets

U.S. PATENT DOCUMENTS

2006/0171080 A1     8/2006    Yamaguchi
2008/0273272 A1*   11/2008   Yao ............................ 360/294

FOREIGN PATENT DOCUMENTS

JP           9213036       8/1997
JP         2001308125    11/2001

OTHER PUBLICATIONS

Dictionary.com, definition of "column", Dec. 17, 2008, htp://dictionary.reference.com/browse/column.*

Hirano, et al., "HDD Tracking Microactuator and Its Integration Issues", *Mems* -vol. 2, (2000).

Hirano, et al., "3 Khz Servo Bandwidth Demonstration By HDD Tracking Microactuator", *ASME International Mechanical Engineering Congress and Exposition*, (Nov. 11, 2001),131-135.

Hirano, et al., "A Moving-Slider MEMS Actuator for High-Band HDD Tracking", *IEEE Transactions on Magnetics*, vol. 40, No. 4, (Apr. 2004),3171-3173.

* cited by examiner

THERMALLY INSULATING BONDING PAD STRUCTURE FOR SOLDER REFLOW CONNECTION

TECHNICAL FIELD

This invention relates to the field of electronic component soldering.

BACKGROUND ART

Currently, electronic components are present in nearly all varieties of products. Types of products in which electronic components can be present are any powered device including, but which is not limited to, household and commercial appliances, means of transportation, construction equipment and tools, farming vehicles, irrigation systems, security systems, health care devices, electronic devices, etc. The list is nearly endless.

Within the field of electronic devices which can include, but is not limited to, computer systems (server, desktop, laptop, etc.), cellular phones, entertainment devices, music and video players, personal digital assistants, and the endless combinations thereof, each have therewithin a number of electronic components, e.g., chips, controllers and other internal devices. These components commonly require coupling to other components. Additionally, there is continuing development for faster, smaller and more efficient electronic components.

As an example, a computer storage system, e.g., a hard disk drive, may include a magnetic hard disk(s) or drive(s) within an outer housing or base containing a spindle motor assembly having a central drive hub that rotates the disk. An actuator includes a plurality of parallel actuator arms in the form of a comb that is movably or pivotally mounted to the base about a pivot assembly. A controller is also mounted to the base for selectively moving the comb of arms relative to the disk.

Each actuator arm has extending from it at least one cantilevered electrical lead suspension. A magnetic read/write transducer or head is mounted on a slider and secured to a flexure that is flexibly mounted to each suspension. The read/write heads magnetically read data from and/or magnetically write data to the disk. The level of integration called the head gimbal assembly (HGA) is the head and the slider, which are mounted on the suspension. The slider is usually bonded to the end of the suspension.

A suspension has a spring-like quality, which biases or presses the air-bearing surface of the slider against the disk to cause the slider to fly at a precise distance from the disk. Movement of the actuator by the controller causes the head gimbal assemblies to move along radial arcs across tracks on the disk until the heads settle on their set target tracks. The head gimbal assemblies operate and move in unison with one another or use multiple independent actuators wherein the arms can move independently of one another.

To allow more data to be stored on the surface of the disk, more data tracks must be stored more closely together. The quantity of data tracks recorded on the surface of the disk is determined partly by how well the read/write head on the slider can be positioned and made stable over a desired data track. Vibration or unwanted relative motion between the slider and surface of disk will affect the quantity of data recorded on the surface of the disk.

To mitigate unwanted relative motion between the slider and the surface of the disk, HDD manufacturers are beginning implement a secondary actuator in close proximity to the slider. A secondary actuator of this nature is generally referred to as a microactuator because it typically has a very small actuation stroke length, typically plus and minus 1 micron. A microactuator typically allows faster response to relative motion between the slider and the surface of the disk as opposed to moving the entire structure of actuator assembly.

A commonly implemented process, or means, to couple these electronic components is soldering. By virtue of continued miniaturization of electronic components, there is a potential for heat related damage to those electronic components when subjected to soldering processes.

SUMMARY OF THE INVENTION

A thermally insulating bonding pad for solder reflow is described. The bonding pad includes a structure. The structure forms the bonding pad. The bonding pad further includes an insulator formed on the structure. The insulator is configured to be interposed between the structure and a substrate of a component onto which said bonding pad is to be disposed. The bonding pad provides thermal insulation for said substrate when said bonding pad is subject to a solder reflow process being performed thereon.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to embodiment(s) of the present invention. While the embodiments of the present invention will be described in conjunction with electronic components, it is understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, and components have not been described in detail as not to unnecessarily obscure aspects of the present invention.

The discussion will begin with an overview of a hard disk drive and components connected within. The discussion will then focus on embodiments of the invention that provide a thermally insulating bonding pad utilized in a process to communicatively couple a transducer and a suspension. Finally, fabrication of the thermally insulating bonding pad will be discussed. Although embodiments of the thermally insulating bonding pad will be described in a hard disk drive microactuator, it is understood that the embodiments described herein are useful outside of the art of microactuators. The utilization of a thermally insulating bonding pad in a microactuator is but one embodiment and is provided herein merely for purposes of brevity and clarity. In fact, embodiments of the present invention are well suited for implementation in nearly any powered device and/or the electrical components disposed therewithin.

Overview

Figure 1:
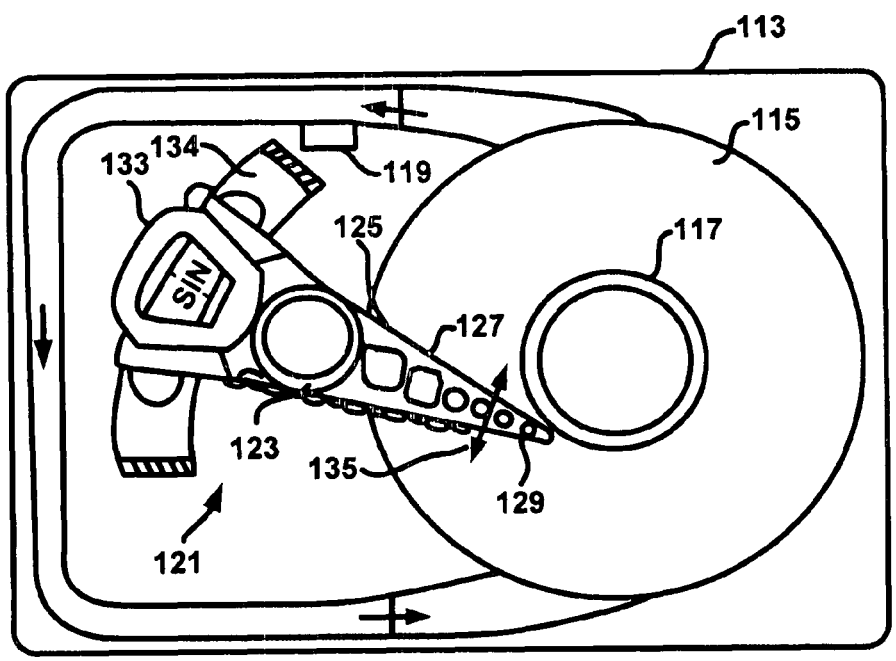
FIG. 1 is plan view of an HDD in accordance with an embodiment of the present invention.

With reference now to FIG. 1, a schematic drawing of one embodiment of an information storage system comprising a magnetic hard disk file or drive 111 for a computer system is shown. Drive 111 has an outer housing or base 113 containing a disk pack having at least one media or magnetic disk 115. A spindle motor assembly having a central drive hub 117 rotates the disk or disks 115. An actuator 121 comprises a plurality of parallel actuator arms 125 (one shown) in the form of a comb that is movably or pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered electrical lead suspension (ELS) 127 (load beam removed). It should be understood that ELS 127 may be, in one embodiment, an integrated lead suspension (ILS) that is formed by a subtractive process. The ELS may be any form of lead suspension that can be used in a Data Access Storage Device, such as an HDD. A magnetic read/write transducer or head is mounted on a slider 129 and secured to a flexure that is flexibly mounted to each ELS 127. The read/write heads magnetically read data from and/or magnetically write data to disk 115. The level of integration called the head gimbal assembly is the head and the slider 129, which are mounted on suspension 127. The slider 129 is usually bonded to the end of ELS 127

ELS 127 has a spring-like quality, which biases or presses the air-bearing surface of the slider 129 against the disk 115 to cause the slider 129 to fly at a precise distance from the disk 115. ELS 127 has a hinge area that provides for the spring-like quality, and a flexing interconnect (or flexing interconnect) that supports read and write traces through the hinge area. A voice coil 133, free to move within a conventional voice coil motor magnet assembly 134 (top pole not shown), is also mounted to arms 125 opposite the head gimbal assemblies. Movement of the actuator 121 (indicated by arrow 135) by controller 119 causes the head gimbal assemblies to move along radial arcs across tracks on the disk 115 until the heads settle on their set target tracks. The head gimbal assemblies operate in a conventional manner and always move in unison with one another, unless drive 111 uses multiple independent actuators (not shown) wherein the arms can move independently of one another.

Figure 2:
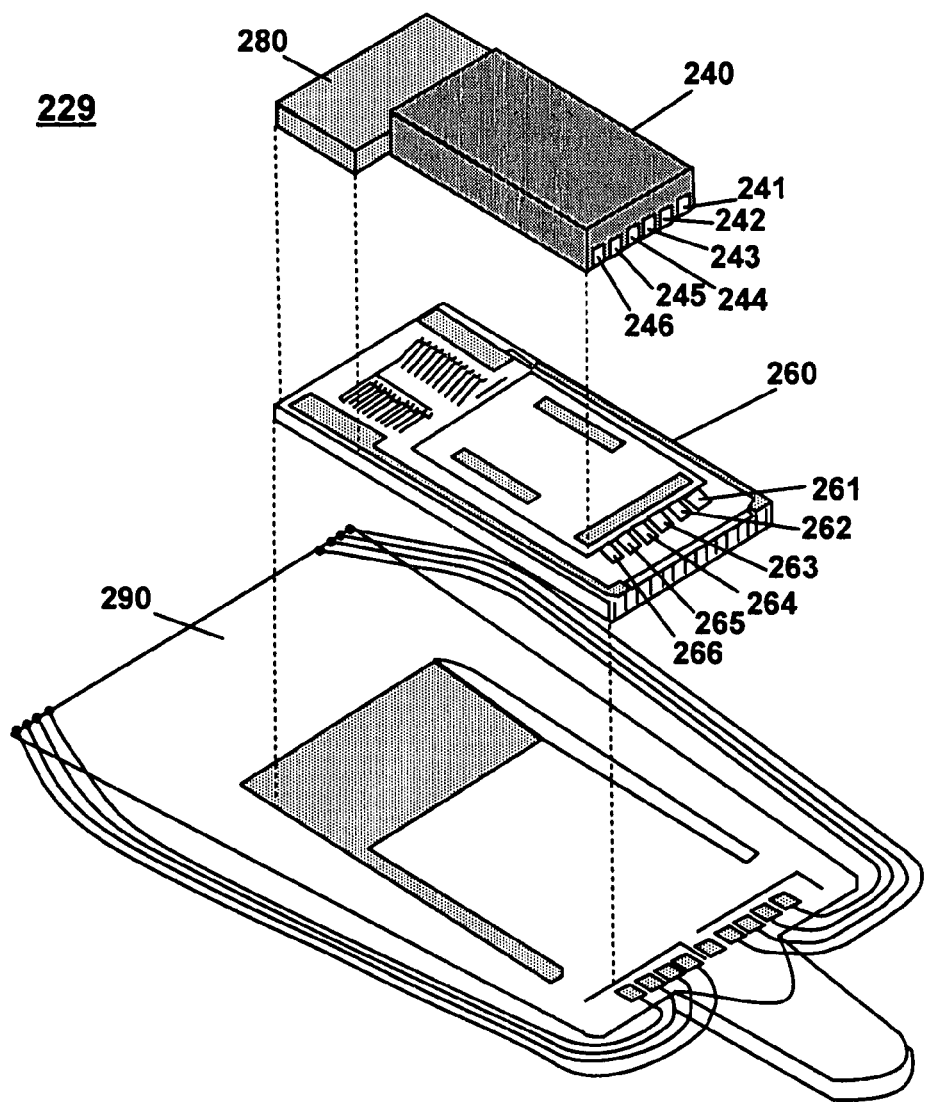
FIG. 2 is an inverted isometric view of the slider assembly of FIG. 1, in accordance with an embodiment of the present invention.

With reference to FIG. 2, detail 229 is the most distal end of the assembly comprising slider 129 of FIG. 1, including a read/write magnetic head 240, a PZT ceramic 280, a suspension 290 and a microactuator 260. When these components are coupled together, as an assembly they are known as a head gimbal assembly or HGA When microactuator 260 is interposed between head 240 and suspension 290 it moves head 240 and PZT ceramic 280 with respect to suspension 290, in accordance to the position of data tracks 135 of FIG. 1.

FIG. 2 is an inverted isometric view of an HGA 229, which is an assembly of slider 129 and an ELS 127 of FIG. 1. HGA 229 shown to include a piezoelectric type (PZT) ceramic 280, a read/write transducer (magnetic head) 240, a microactuator 260, and a suspension 290, each of which are intercommunicatively coupleable and within which microactuator 260 is interposed between magnetic head 240 and suspension 290. In the embodiment shown, microactuator 260 includes a plurality of component data interconnects or data transmission lines terminating in bonding pads 261, 262, 263, 264, 265 and 266, and magnetic head 240 includes a plurality of data transmission lines terminating in bonding pads 241, 242, 243, 244, 245 and 246. It is noted that each data communication line associated with each bonding pad 241-246 or 261-266 may terminate within and/or couple with another communication line within and/or provide an additional externally accessible communicative connection for the component in which it is disposed. It is further noted that bonding pad 261 of microactuator 260 is associated with bonding pad 241 of magnetic head 240; pad 262 is associated with pad 242, and so on.

Although six bonding pads are shown on microactuator 260 of FIG. 2, it is noted that microactuator 260 may be configured to have a greater or lesser number of bonding pads.

Although embodiments of the present invention are described in the context of a microactuator in an information storage system, it should be understood that embodiments may apply to devices utilizing an electrical interconnect that might experience heat related damage associated with a solder reflow process performed thereon. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. Embodiments of the present invention are well suited for implementation in nearly any electronic device, component interconnect, mounting need and/or fabrication process that may be susceptible to heat related damage during solder reflow processes that are performed thereon.

BEST MODES FOR CARRYING OUT THE INVENTION

Figure 3:
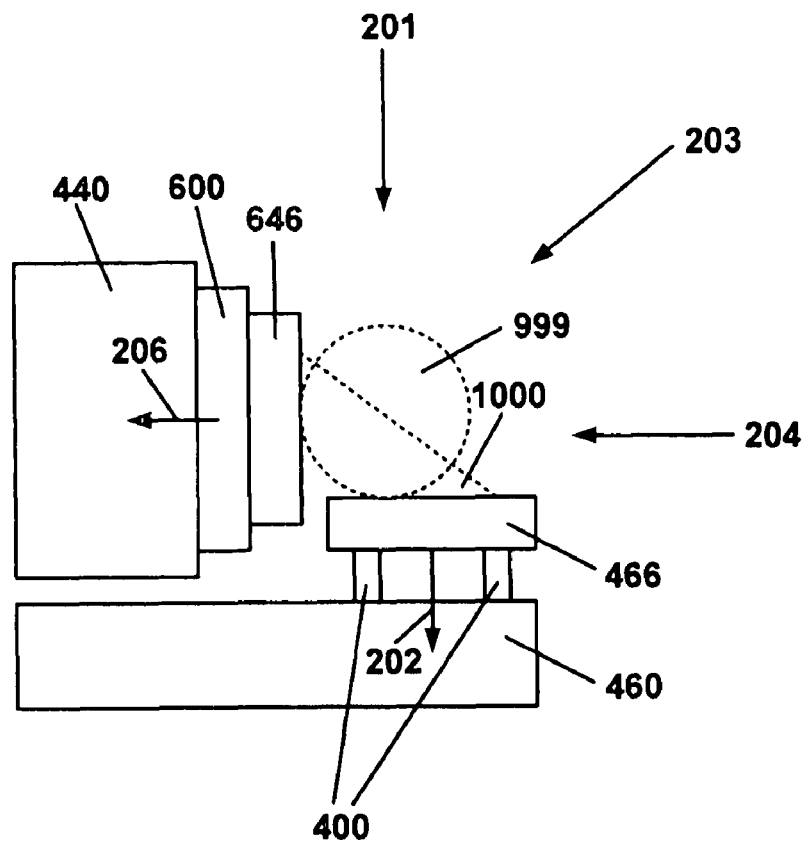
FIG. 3 is a plan view of thermally insulating bonding pads in accordance with an embodiment of the present invention.

FIG. 3 is a profile view of an environment 300 having implemented therein thermally insulating bonding pads in accordance with embodiments of the present invention. FIG. 3 is representative of general orientation of bonding pad 246 of slider 240 (shown as substrate 440) relative to bonding pad 266 of microactuator 260 (shown as substrate 460) of FIG. 2 and upon which a solder reflow may be performed in accordance with embodiments of the present invention.

Substrate 460 is shown to have a thermally insulating layer 400 interposed between a bonding pad 466 in an embodiment of the present invention. Insulating layer 400 is, in the present embodiment, shown to be comprised of a plurality of wall structures. Fabrication of insulating layer 400 is described in FIGS. 4A-4C, FIGS. 4D-4G and FIGS. 4H-4I, in embodiments of the present invention. Alternative insulating layer configurations are shown in FIGS. 5B-5E in accordance with embodiments of the present invention.

Substrate 440 is shown to have a thermally insulating layer 600 interposed between bonding pad 646 and slider 440 in accordance with another embodiment of the present invention. Fabrication of insulating layer 600 is described in FIGS. 6A-6C and FIGS. 6D-6E, in an embodiment of the present invention.

Although insulating layer 400 is shown disposed on substrate 460 and insulating layer 600 is shown disposed on substrate 440, it is noted that insulating layer 400 may be disposed on substrate 440 and insulating layer 600 may be disposed on substrate 460.

In an embodiment of the present invention, insulating layer 400 can be comprised of either thermally insulating material or thermally conductive material, e.g., metal, as shown and described with reference to FIGS. 4A-4I. Thermal insulation is achieved by minimizing the cross-sectional area through which the heat flows toward the substrate e.g., substrate 460, e.g., arrow 202. FIGS. 5A-5E are examples of possible configurations for minimizing heat flow to the substrate.

In another embodiment of the present invention, as shown and described with reference to Figures embodiment of the present invention and by virtue of insulating layer 600 having its cross-sectional area in contact with substrate 440, insulating layer 600 is comprised of a thermally insulating material. Examples of a thermally insulating material can include, but is not limited to, polyimides, plastics, and other materials that comprise characteristics for thermal insulation. It is noted that layer 400 layer 600 may be comprised of analogous or differing thermally insulating materials and that those insulating materials may be comprised of a combination of materials and/or compositions.

FIG. 3 further includes a plurality of heat/energy sources, e.g., energy sources 201, 203 and 204, of which one or more may be applied to a solder ball, e.g., solder ball 999, in environment 300 to achieve a solder reflow process. In an embodiment of the present invention, solder ball 999 may be placed upon bonding pad 466 and proximal to bonding pad 646 and receive an amount of energy, e.g., energy source 201, so as to reflow solder ball 999, such that a solder reflow joint 1000 is achieved. In another embodiment, solder ball 999 may be a melted solder ball that is disposed upon bonding pad 446 and proximal to bonding pad 646 and is then reflowed to achieve solder reflow joint 1000.

Energy source 201, when applied, generates heat/energy downward toward substrate 460, as indicated by arrow 202. Energy 201 may also radiate toward substrate 440, indicated by arrow 206. In accordance with an embodiment of the present invention, insulating layer 400 and insulating layer 600 restrict or halt energy flow 202 and 206, such that substrate 460 and substrate 440 are not subjected heat related damage during the reflow process.

Energy source 204, when applied, generates heat/energy laterally toward substrate 440, as indicated by arrow 206. Energy 204 may also radiate toward substrate 640, indicated by arrow 202. In accordance with an embodiment of the present invention, insulating layer 400 and insulating layer 600 restrict or halt energy flow 202 and 206, such that substrate 460 and substrate 440 are not subjected heat related damage during the reflow process.

Energy source 203, when applied, generates heat/energy toward substrate 440 and substrate 460, as indicated by arrows 202 and 206. In accordance with an embodiment of the present invention, insulating layer 400 and insulating layer 600 restrict or halt energy flow 202 and 206, such that substrate 460 and substrate 440 are not subjected heat related damage during the reflow process.

It is noted that thermally insulating layer 400 and 600 restrict or stop the heat energy to be dissipated into substrates 460 and substrate 440, such that energy applied from outside, e.g., energy 201, 203 or 204 is "trapped" inside solder ball 999 and bonding pad surfaces 466 and 646. Thus, the temperature will be increased for the same energy given. Accordingly, embodiments of the present invention achieve a reduction in the external energy needed to perform a reflow process on a solder ball 999.

There are many solder reflow techniques. They include, but are not limited to: placing a solder preform, such as a solder ball 999, upon microactuator 460 (or slider 440), followed with the application of an energy source, e.g., energy source 201, 203 and/or 204. Alternatively, solder ball 999 may be a melted solder bar placed upon microactuator 460 (or slider 440). Energy sources 201, 203 and/or 204 can be, but are not limited to, a laser, a focused infrared light, an oven, and the like. Alternatively, tinning, which is the technique of applying a film of solder on a surface is varied and well known in the art may be implemented.

Figure 4A:
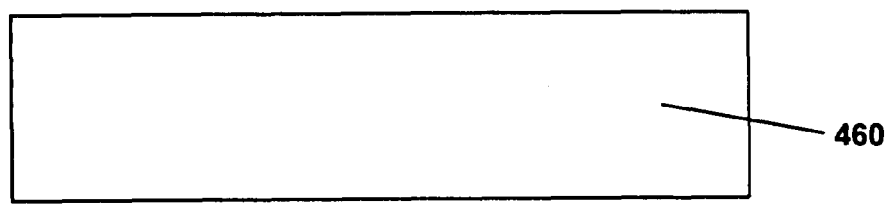
FIG. 4A is a sequential block diagram of a process for the fabrication of a thermally insulating bonding pad of FIG. 3 in an embodiment of the present invention.
Figure 4B:
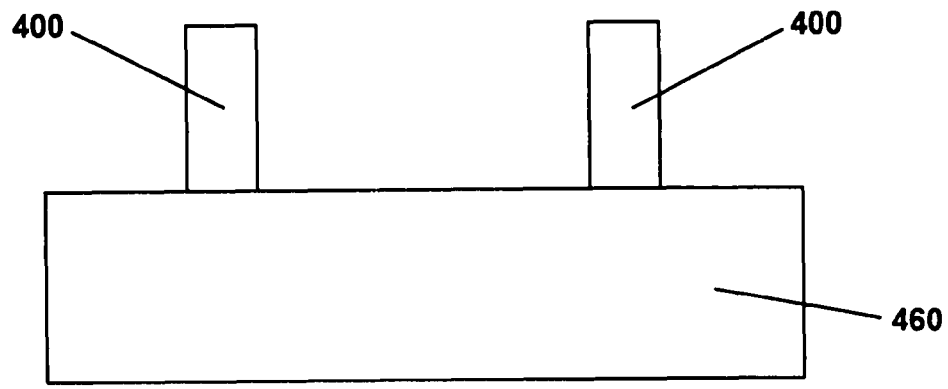
FIG. 4B is a sequential block diagram of the process for the fabrication of the thermally insulating bonding pad of FIG. 4A.
Figure 4C:
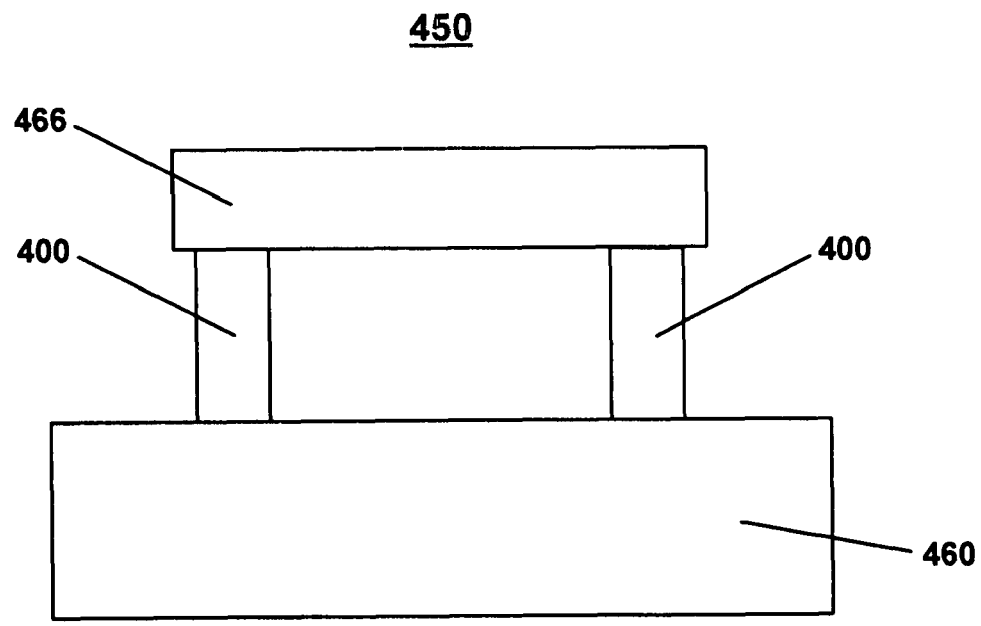
FIG. 4C is a sequential block diagram of a process for the fabrication of the thermally insulating bonding pad of FIG. 4B.

FIGS. 4A, 4B and 4C are sequential block diagrams of a process 450 for the fabrication of a thermally insulating bonding pad in an embodiment of the present invention.

FIG. 4A is a block diagram of process 450 for fabricating a thermally insulating bonding pad 466 in which an initial substrate 460 is fabricated. In the present embodiment, a substrate, e.g., microactuator 460 is fabricated from silicon. It is noted that nearly any substrate fabrication process may be utilized to fabricate substrate 460.

FIG. 4B is a sequential block diagram of process 450 of FIG. 4A. Substrate 460 is shown to have had an additive process performed thereon, such that that substrate 460 has an insulator layer 400 disposed above substrate 460. Alternatively, an additive and subtractive process may be implemented in combination implemented to achieve insulator layer 400. Fabrication of insulator layer 400 creates a platform support that elevates bonding pad 466 above substrate 460, in an embodiment of the present invention. It is noted that nearly any additive and/or subtractive process may be utilized to fabricate insulator layer 400 on substrate 460. In the present embodiment, insulator layer 400 is characteristically compatible to substrate 460 while providing thermal insulation.

FIG. 4C is a sequential block diagram of process 450 of FIG. 4B. Substrate 460, configured with insulator layer 400, is shown to have fabricated thereon a bonding pad 466 via a deposition process. It is noted that nearly any deposition process may be utilized to fabricate bonding pad 466. In the present embodiment, bonding pad 466 is characteristically compatible with insulator layer 400 and substrate 460.

Although process 450 is shown performed in a bottom up process, process 450 may be performed in a top down process, such that bonding pad 466 is formed and upon which insulator layer 400 is then formed, and then substrate 460 is subsequently formed and onto which bonding pad 466 and layer 400 are disposed.

FIGS. 4D, 4E, 4F and 4G are sequential block diagrams of a process 451 for the fabrication of a thermally insulated bonding pad in accordance with another embodiment of the present invention.

Figure 4D:
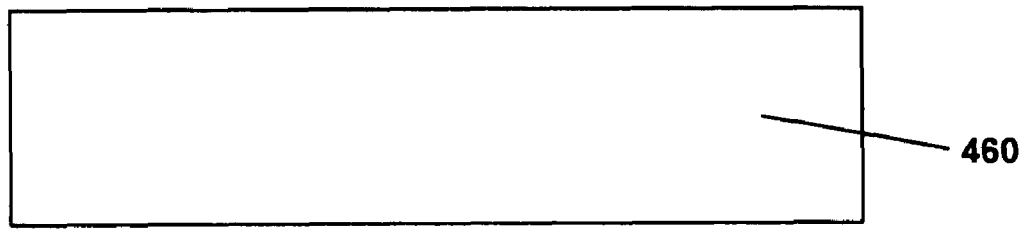
FIG. 4D is an initial sequential block diagram of a process for fabrication of a thermally insulated bonding pad in accordance with another embodiment of the present invention.

FIG. 4D is a block diagram for fabricating a thermally insulating bonding pad 466 in which an initial substrate is fabricated. In the present embodiment substrate 460 may be fabricated from silicon. It is noted that nearly any fabrication process may be utilized to fabricate substrate 460.

Figure 4E:
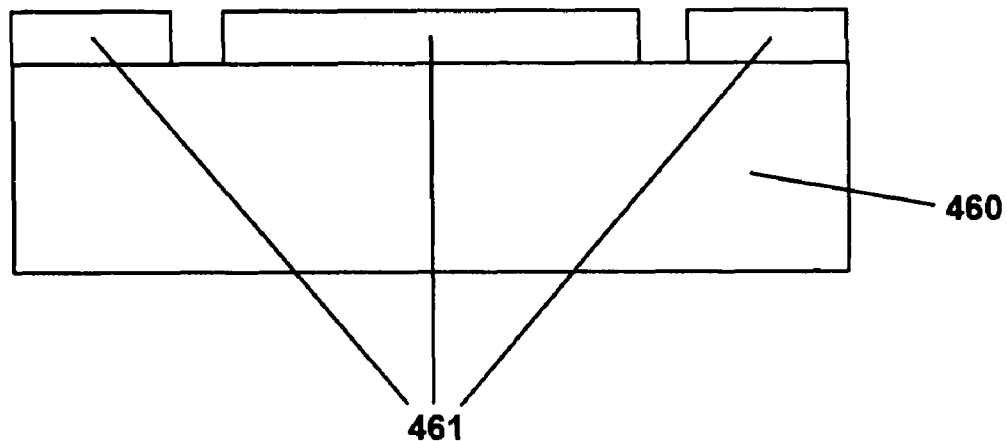
FIG. 4E is a sequential block diagram of the process of FIG. 4D showing deposition of a sacrificial layer.

FIG. 4E is a sequential block diagram of process 451 of FIG. 4D. Substrate 460 has had a deposition process performed thereon, so as to form a patterned sacrificial layer on substrate 460, e.g., sacrificial layer 461. In an embodiment of the present invention, sacrificial layer 461 is photo-resist. Alternatively, materials other than photo-resist can be implemented as sacrificial layer 461 with the caveat being characteristically compatible with a removal process that is to be performed on the sacrificial layer, with reference to FIG. 4G.

Figure 4F:
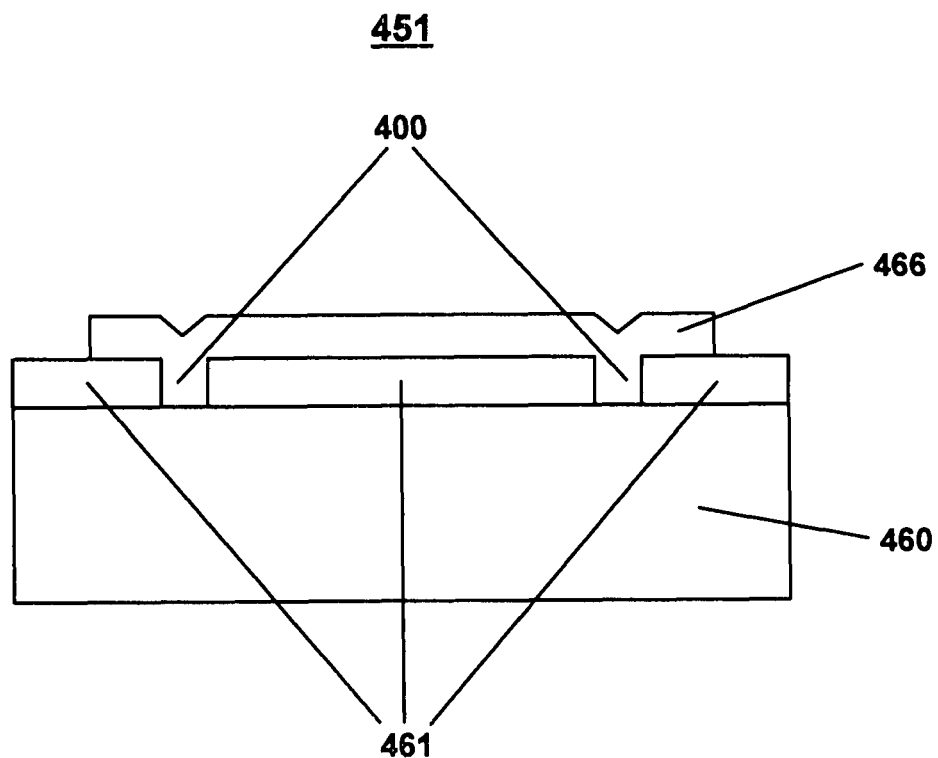
FIG. 4F is a sequential block diagram of the process of FIG. 4E showing deposition of a bonding pad.

FIG. 4F is a sequential block diagram of process 451 of FIG. 4E, in which a bonding pad 466 is formed on sacrificial layer 461. In the present embodiment, insulating layer 400 and bonding pad 466 are formed from the patterning of sacrificial layer 461. In an embodiment, bonding pad 466 is metal in composition.

Figure 4G:
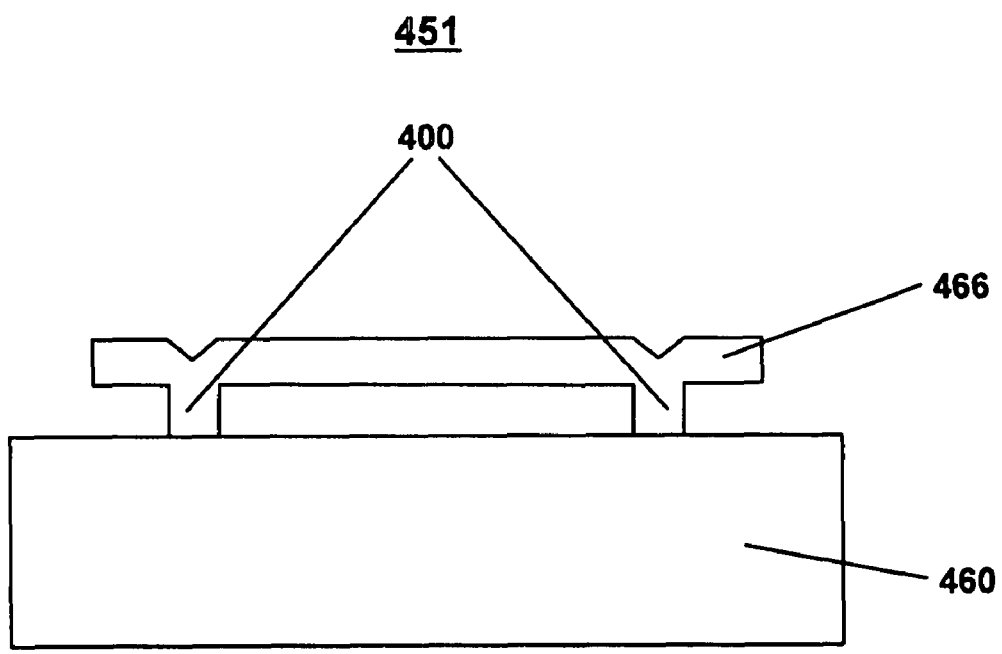
FIG. 4G is a sequential block diagram of the process of FIG. 4F showing the thermally insulating bonding pad subsequent to the removal of the sacrificial layer of FIG. 4E.

FIG. 4G is a sequential block diagram of process 451 of FIG. 4F, in which a subtractive process has been performed thereon. Substrate 460 is shown having insulating layer 400 and bonding pad 466 formed thereon. In an embodiment, a process for removing sacrificial layer 461, such that sacrificial layer 461 is removed. In the embodiment shown, as sacrificial layer 461 is described as photo resist, an organic solvent can be utilized for removal, although alternative processes and materials for removal may be implemented. It is noted that examples of bonding pad configurations formed in conjunction with process 451 are shown with reference to FIGS. 5A-5E.

Figure 4H:
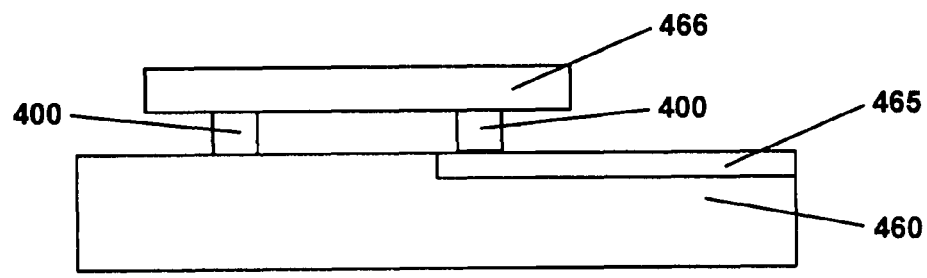
FIG. 4H is a block diagram of a thermally insulating bonding pad, as shown in FIGS. 4C and 4G, having a signal coupled with a support structure, in accordance with an embodiment of the present invention.
Figure 4I:
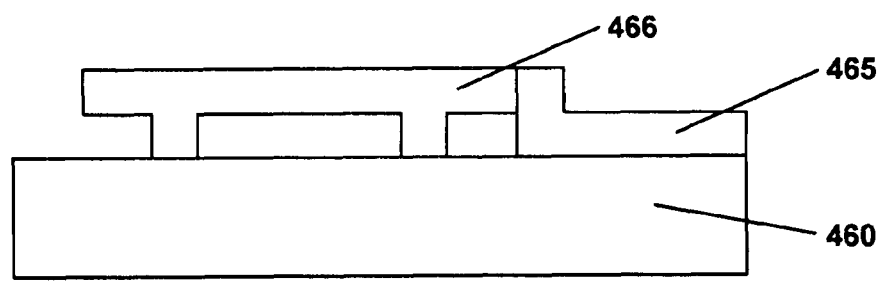
FIG. 4I is a block diagram of a thermally insulating bonding pad, as shown in FIGS. 4C and 4G, having a signal wire coupled to a side of the bonding pad, in accordance with an embodiment of the present invention.

Although embodiments of the present invention, as shown in FIG. 3 and FIGS. 4A-4G, are depicted as non-communicative bonding pads, such as for positional orientation of one component relative to another component, embodiments of the present invention are readily adaptable to include electrical/communicative coupling. FIGS. 4H and 4I are block diagrams depicting a communicative wire coupled to a thermally insulated bonding pad, in accordance with embodiments of the present invention.

FIG. 4H is a block diagram of a thermally insulated bonding pad as described herein with reference to FIGS. 3, 4C and 4G, in which a signal connection is enabled, in accordance with an embodiment of the present invention. In the embodiment shown, substrate 460 has had formed therein a communication wire 465 for electrical and/or communicative coupling between two components, e.g., slider 240 and microactuator 260 of FIG. 2. In an embodiment, communication wire 465 may be formed/deposited during formation of substrate 460. In another embodiment, communication wire 465 may be deposited in an area of substrate 460 subsequent to a subtractive/removal process performed on substrate 460.

Shown are substrate 460 and insulating layer 400 interposed between substrate 460 and bonding pad 466 in an embodiment of the present invention. In the present embodiment, communication wire 465 is shown coupled to one of the structure elements of insulating layer 400.

FIG. 4I is a block diagram of a thermally insulated bonding pad as described herein with reference to FIGS. 3, 4C and 4G, in which an electrical/communicative coupling is enabled, in accordance with an embodiment of the present invention. In the embodiment shown, substrate 460 has had formed thereon a communication wire 465 for electrical and/or communicative coupling between two components, e.g., slider 240 and microactuator 260 of FIG. 2. In an embodiment, communication wire 465 may be formed/deposited during formation of substrate 460. In another embodiment, communication wire 465 may be formed/deposited in an area of substrate 460 subsequent to fabrication of substrate 460.

Shown are substrate 460 and insulating layer 400 interposed between substrate 460 and bonding pad 466 in an embodiment of the present invention. In the present embodiment, communication wire 465 is shown disposed above substrate 460 and abutted to a surface of bonding pad 466.

Figure 5A:
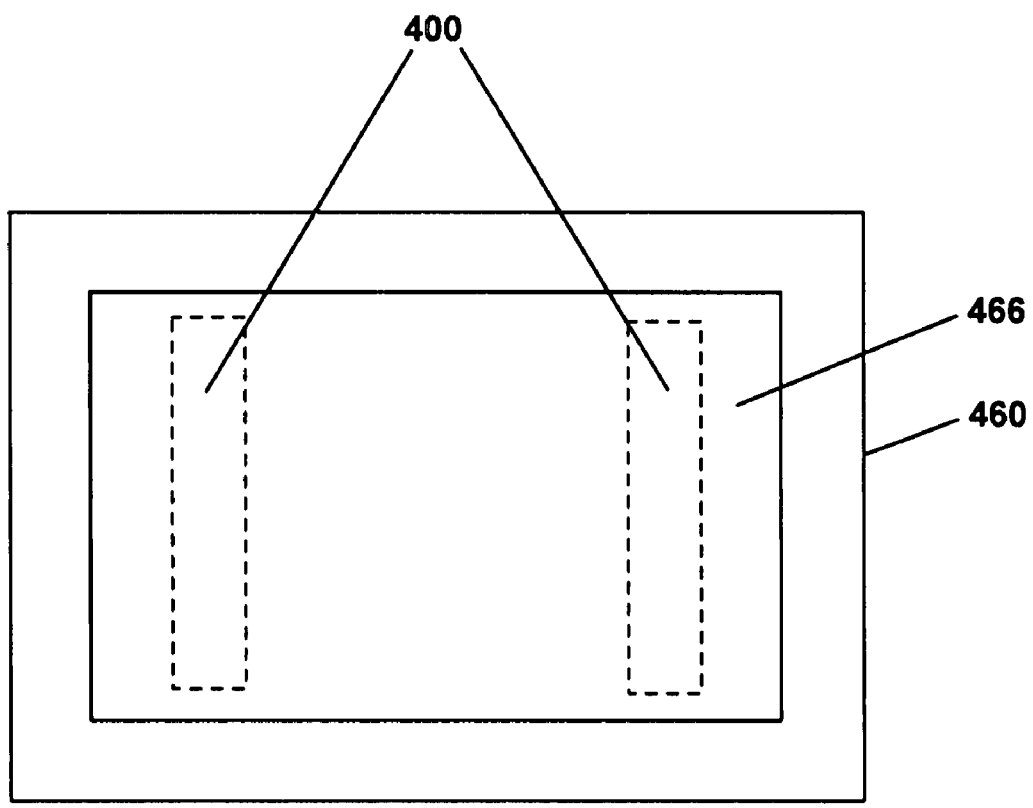
FIG. 5A is a top view of the thermally insulating bonding pad of FIG. 4B in an embodiment of the present invention.

FIG. 5A is a top view of the thermally insulating bonding pad of FIG. 4C and FIG. 4G in which the insulator layer 400 is shown interposed between a bonding pad 466 and a substrate 460 in accordance with an embodiment of the present invention. In the embodiment shown, insulator layer 400 is depicted as a plurality of parallel wall structures that are oriented to provide a stable platform upon which bonding pad 466 is disposed, as is shown with reference to FIGS. 4C and 4G.

Figure 5B:
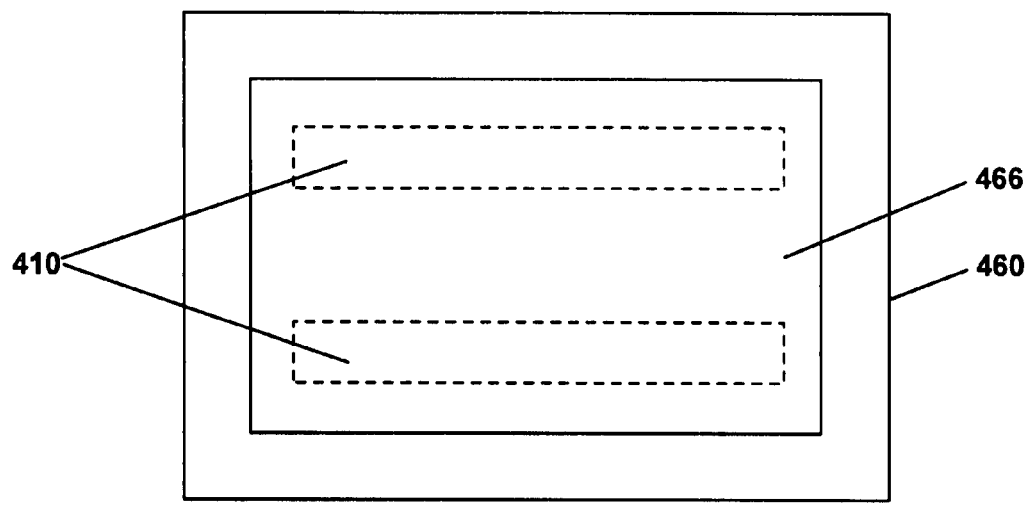
FIG. 5B is a top view of another thermally insulating bonding pad in accordance with an embodiment of the present invention.

FIG. 5B is a top view of the thermally insulating bonding pad of FIG. 4C in which the insulator layer 400 is shown interposed between a bonding pad 466 and a substrate 460 in accordance with another embodiment of the present invention. In the embodiment shown, insulator layer 400 is depicted as a plurality of parallel wall structures (oriented perpendicularly relative to the insulator layer of FIGS. 4C, 4G and 5A) and which also provides a stable platform upon which bonding pad 466 is disposed.

Figure 5C:
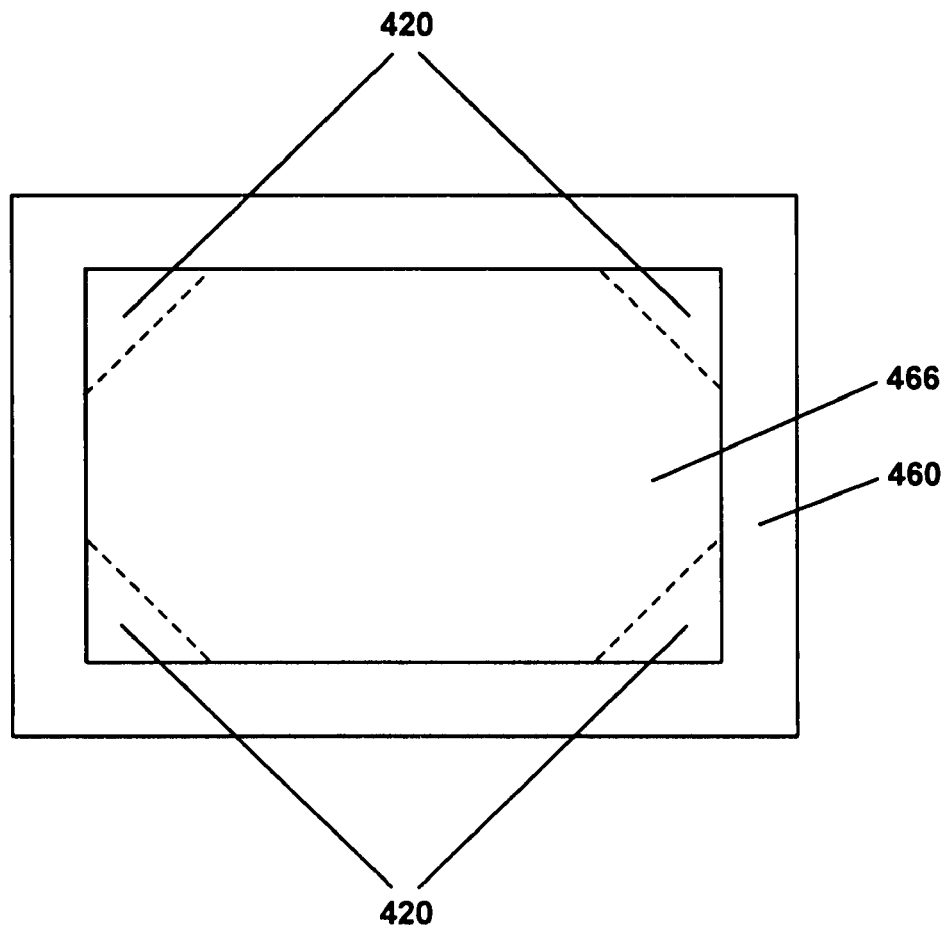
FIG. 5C is a top view of yet another thermally insulating bonding pad in accordance with an embodiment of the present invention.

FIG. 5C is a top view of the thermally insulating bonding pad of FIG. 4C in which an insulator layer 420, functionally analogous to insulating layer 400 of FIG. 3 and FIGS. 4A-4G, is shown interposed between a bonding pad 466 and a substrate 460 in accordance with yet another embodiment of the present invention. In the embodiment shown, insulator layer 420 is depicted as a plurality of triangularly shaped corner columns that are located toward the outer proximity of the corners of bonding pad 466. Insulator layer 420 provides a stable platform upon which bonding pad 466 is disposed.

Figure 5D:
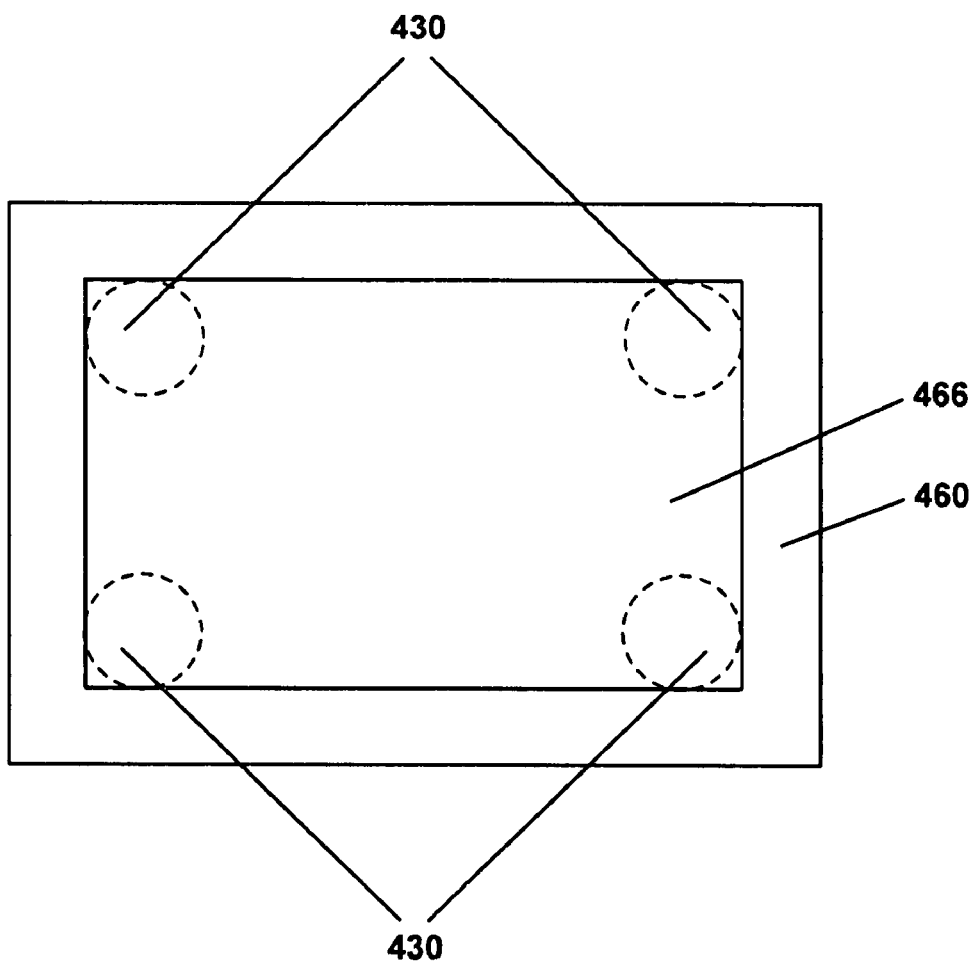
FIG. 5D is a top view of still another thermally insulating bonding pad in accordance with an embodiment of the present invention.

FIG. 5D is a top view of the thermally insulating bonding pad of FIG. 4C in which an insulator layer 430, functionally analogous to insulating layer 400 of FIG. 3 and FIGS. 4A-4G, is shown interposed between a bonding pad 466 and a substrate 460 in accordance with still another embodiment of the present invention. In the embodiment shown, insulator layer 430 is depicted as a plurality of circular shaped columns that are located toward the outer proximity of the corners of bonding pad 466.

Figure 5E:
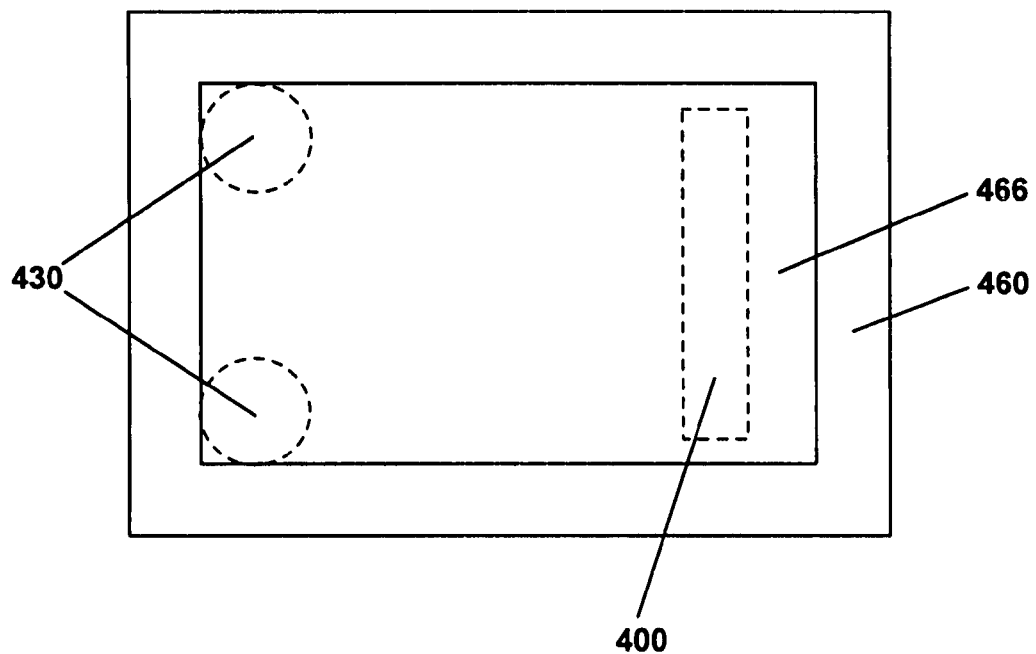
FIG. 5E is a top view of yet still another thermally insulating bonding pad in accordance with an embodiment of the present invention.

FIG. 5E is a top view of the thermally insulating bonding pad of FIG. 4C in which a combination of insulating layer patterns are implemented, in an embodiment of the present invention. Shown are a portion of insulator layer 430 (FIG. 5D) and a portion of insulating layer 400 (FIGS. 3, 4A-4G) that are interposed between a bonding pad 466 and a substrate 460. In the embodiment shown, a plurality of circular shaped columns (as shown in FIG. 5D) are combined with a wall structure (as shown in FIG. 5A) in which the circular shaped columns are located toward the outer proximity of the corners of bonding pad 466. It is noted that many other alternative configurations and patterns can be readily implemented as a thermally insulating bonding pad in accordance with embodiments of the present invention.

Figure 6A:
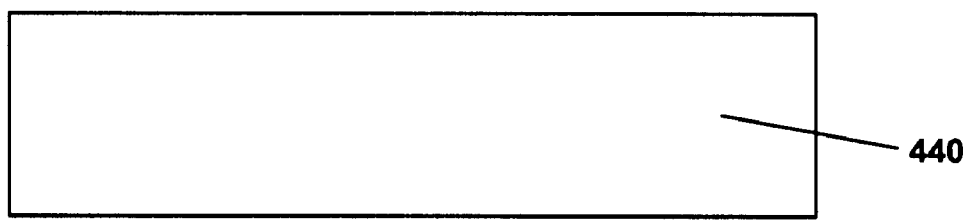
FIG. 6A is a sequential block diagram of a process for the fabrication of a thermally insulating bonding pad of FIG. 3, in accordance with another embodiment of the present invention.
Figure 6B:
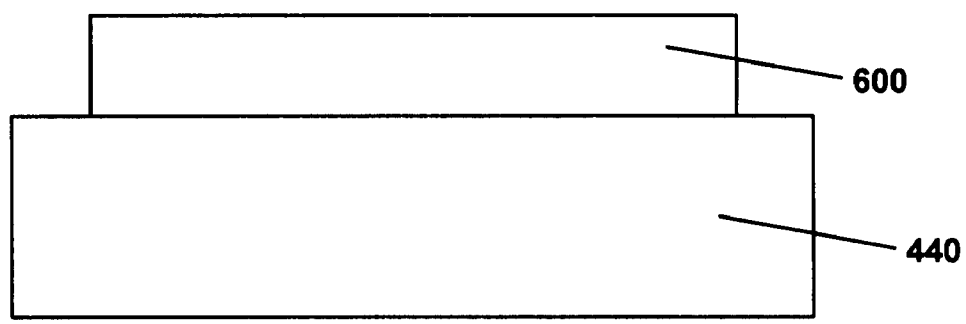
FIG. 6B is a sequential block diagram of the process for the fabrication of the thermally insulating bonding pad of FIG. 6A.
Figure 6C:
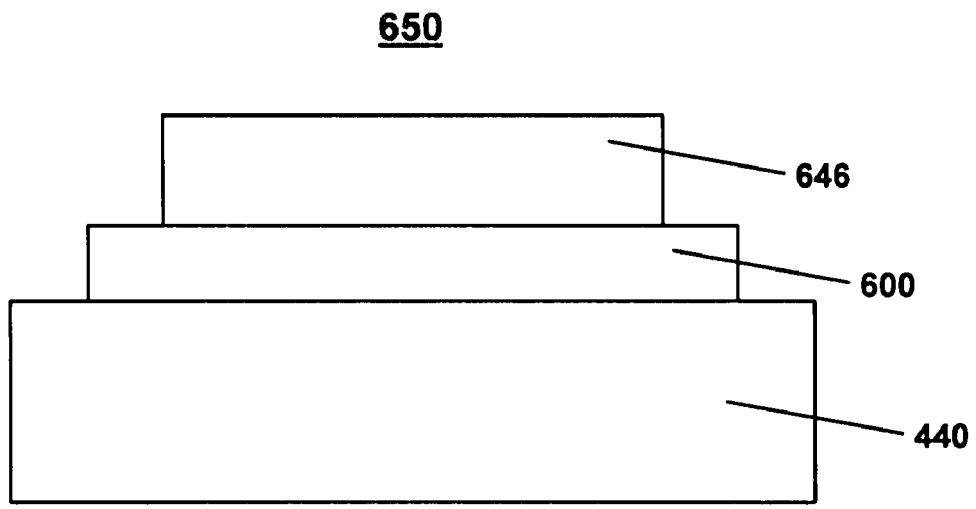
FIG. 6C is a sequential block diagram of the process for the fabrication of the thermally insulating bonding pad of FIG. 6B.

FIGS. 6A, 6B and 6C are sequential block diagrams of a process 650 for the fabrication of a thermally insulating bonding pad in an embodiment of the present invention.

FIG. 6A is a block diagram of process 650 for fabricating a thermally insulating bonding pad 646 in which an initial substrate 440 is fabricated. In the present embodiment, substrate 440 may be fabricated from silicon. It is noted that nearly any substrate fabrication process may be utilized to fabricate substrate 440.

FIG. 6B is a sequential block diagram of process 650 of FIG. 6A. Substrate 440 is shown to have had an additive process performed thereon, such that that substrate 440 has an insulator layer 600 disposed above substrate 440. Alternatively, an additive and subtractive process may be combinationally implemented to achieve insulator layer 600. Fabrication of insulator layer 600 creates a platform support that elevates bonding pad 646 above substrate 440, in an embodiment of the present invention. It is noted that nearly any additive and/or subtractive process may be utilized to fabricate insulator layer 600 on substrate 440. In the present embodiment, insulator layer 600 is characteristically compatible to substrate 440 while providing thermal insulation.

FIG. 6C is a sequential block diagram of process 650 of FIG. 6B. Substrate 440, configured with insulator layer 600, is shown to have fabricated a bonding pad 646 upon insulator layer 600 via a deposition process. It is noted that nearly any deposition process may be utilized to fabricate bonding pad 646. In the present embodiment, bonding pad 646 is characteristically compatible with insulator layer 600 and substrate 440.

Although process 650 is shown performed in a bottom up process, process 650 may be performed in a top down process, such that bonding pad 646 is formed and upon which insulator layer 600 is then formed, and then substrate 440 is subsequently formed and onto which bonding pad 646 and layer 600 are disposed.

Figure 6D:
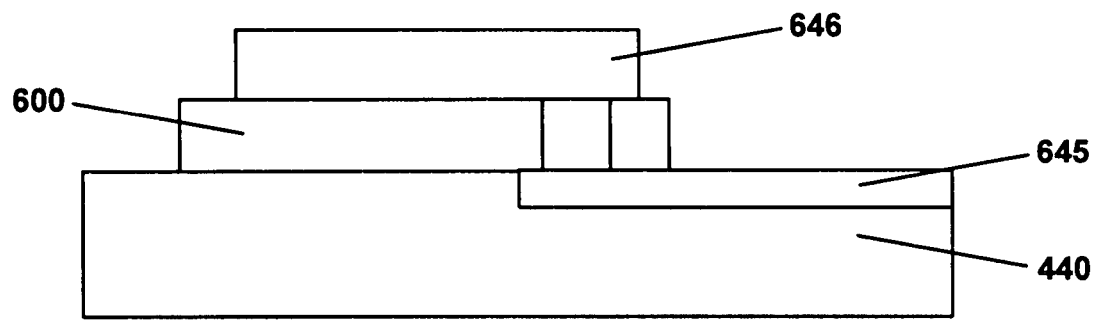
FIG. 6D is a block diagram of the thermally insulating bonding pad of FIG. 6C having a signal wire coupled to the bonding pad via an opening in the insulating layer, in accordance with an embodiment of the present invention.
Figure 6E:
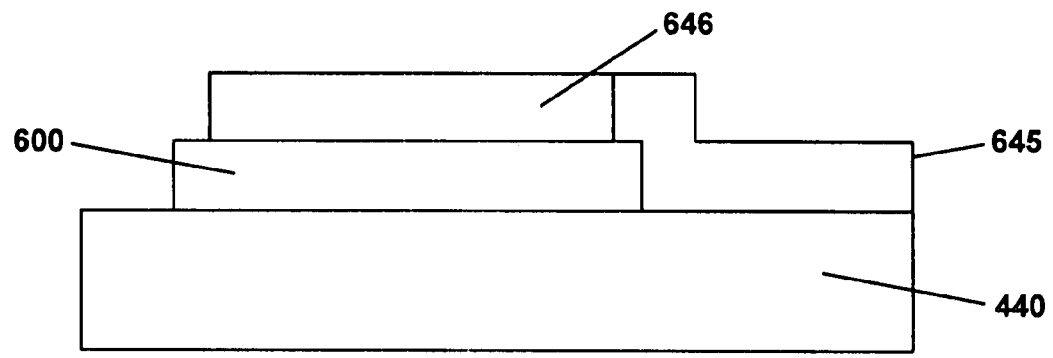
FIG. 6E is a block diagram of the thermally insulating bonding pad of FIG. 6C having a signal wire coupled with a side of the bonding pad, in accordance with an embodiment of the present invention.

Although embodiments of the present invention, as shown in FIG. 3 and FIGS. 6A-6C, are depicted as non-communicative bonding pads, such as for positional orientation of one component relative to another component, embodiments of the present invention are readily adaptable to include electrical/communicative coupling. FIGS. 6D and 6E are block diagrams depicting a communicative wire coupled to a thermally insulated bonding pad, in accordance with embodiments of the present invention.

FIG. 6D is a block diagram of a thermally insulated bonding pad as described herein with reference to FIGS. 3 and 6C, in which a signal connection is enabled, in accordance with an embodiment of the present invention. In the embodiment shown, substrate 440 has had formed therein a communication wire 645 for electrical and/or communicative coupling between two components, e.g., slider 240 and microactuator 260 of FIG. 2. In an embodiment, communication wire 645 may be formed/deposited during formation of substrate 460. In another embodiment, communication wire 645 may be deposited in an area of substrate 440 subsequent to a subtractive/removal process performed on substrate 440.

Shown is insulating layer 600 interposed between substrate 440 and bonding pad 646 in an embodiment of the present invention. In the present embodiment, communication wire 645 is shown coupled to a leg structure of insulating layer 646. In an embodiment of the present invention, an additive/subtractive process such as one described with reference to FIGS. 4D-4G, may be implemented to form an opening in insulating layer 600 such that a leg structure of bonding pad 646 contacts communication wire 645.

FIG. 6E is a block diagram of a thermally insulated bonding pad as described herein with reference to FIGS. 3 and 6C, in which an electrical/communicative coupling is enabled, in accordance with an embodiment of the present invention. In the embodiment shown, substrate 440 has had formed thereon a communication wire 645 for electrical and/or communicative coupling between two components, e.g., slider 240 and microactuator 260 of FIG. 2. In an embodiment, communication wire 645 may be formed/deposited during formation of substrate 440. In another embodiment, communication wire 645 may be formed/deposited in an area of substrate 440 subsequent to fabrication of substrate 440.

Shown is insulating layer 600 interposed between substrate 440 and bonding pad 646 in an embodiment of the present invention. In the present embodiment, communication wire 645 is shown disposed above substrate 440 and abutted to a surface of bonding pad 646.

It is noted that although insulating layers 400, 410, 420, 430, 440 and 600 are shown as solid structures in the above figures and related descriptions, in alternative embodiments, the insulating layers 400, 410, 420, 430, 440 and 600 may be hollowed, perforated, or otherwise shaped, contoured or oriented upon a substrate, e.g., slider 440 and microactuator 640

Figure 7:
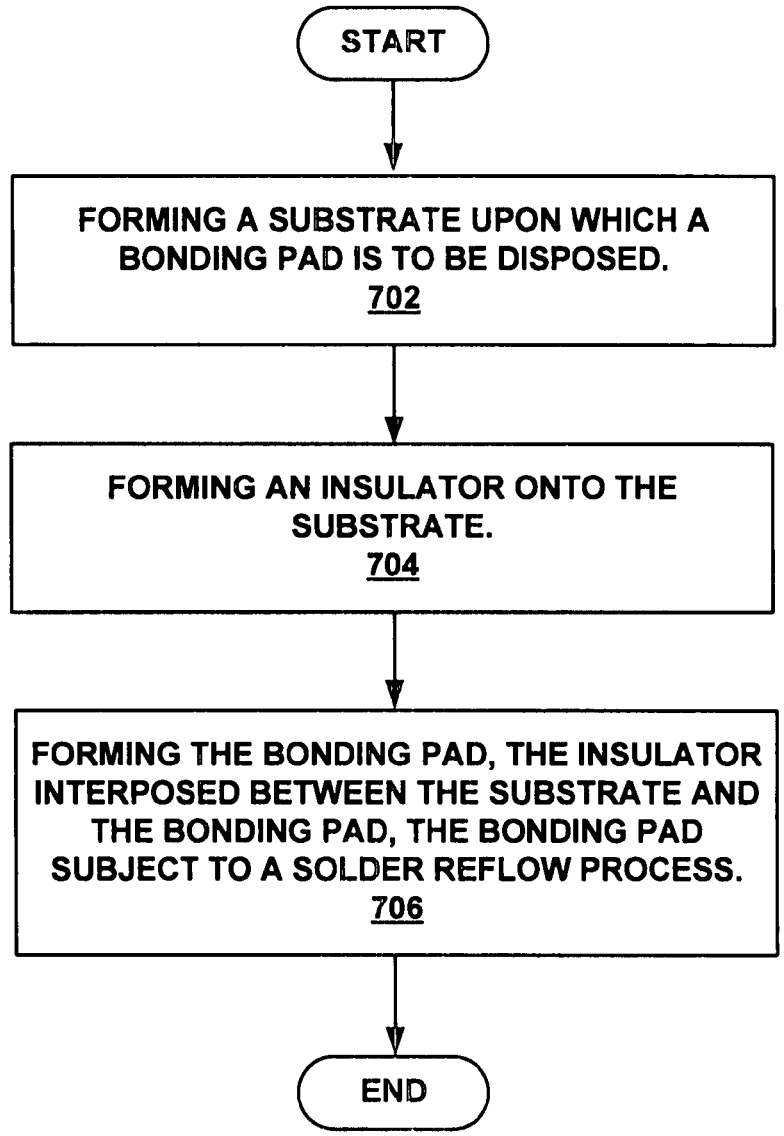
FIG. 7 is a flow chart illustrating steps of a fabrication process for a thermally insulating bonding pad in accordance with one embodiment of the present invention.

FIG. 7 is a flowchart of a process 700 for fabricating a thermally insulating bonding pad in an embodiment of the present invention. FIG. 7 is a flow chart of a process 700 in which particular steps are performed in accordance with an embodiment of the present invention for fabricating a bonding pad having thermal insulating characteristics for implementation in a solder reflow process. Although specific steps are disclosed in process 700, such steps are exemplary. That is, the present invention is well suited to performing various other steps or variations of the steps recited in FIG. 7. Within the present embodiment, it should be appreciated that the steps of process 700 may be performed by software, by hardware, by an assembly mechanism, through human interaction, or by any combination of software, hardware, assembly mechanism, and human interaction.

Process 700 will be described with reference to elements shown in FIG. 3, FIGS. 4A-4I, FIGS. 5A-5E and FIGS. 6A-6E, in accordance with embodiments of the present invention. Process 700 will be described in a bottom up fabrication process, although alternatively process 700 can be performed in a top down fabrication process, in accordance with embodiments of the present invention.

In step 702 of process 700, a suitable substrate, e.g., substrate 440 or 640, respectively, is introduced into process 700 in an embodiment of the present invention. An appropriate substrate for a thermally insulating bonding pad in accordance with an embodiment of the present invention is typically silicon. Other substrates such as glass, quartz or ceramic may also be suitable for process 700.

In step 704 of process 700, an insulating layer, e.g., insulating layer 400 or 600, are formed on substrate 460 or 440, respectively. In an embodiment of the present invention, insulating layers 400 and/or 600 are comprised of polyimide. Alternatively, other materials such as plastic may be implemented as an insulating layer. In an embodiment of the present invention, a deposition process is performed to form an insulating layer, e.g., layers 400 and 600. Alternatively, a combination of a deposition process (e.g., sputtering, chemical vapor deposition (CVD), electro-plating, etc.) and a subtractive process (e.g., wet-etching, ion-milling, etc.) may be performed to achieve an insulating layer 400 or 600.

In step 706 of process 700, a bonding pad, e.g., bonding pad 466 or bonding pad 646, is formed over an insulating layer, e.g., layer 400 and layer 600, respectively. Insulating layer 400 and 600 provide a stable platform upon which a bonding pad may be formed as well as achieving insulation from thermal damage for the substrate upon which the layer is disposed during a solder reflow process performed on the bonding pad.

The present invention, in the various presented embodiments allows for the fabrication of a thermally insulating bonding pad that provides thermal insulation for a substrate. Embodiments of the present invention further realize that by virtue of providing a thermally insulating bonding pad, wetting is achieved while preventing heat related damage upon the substrate upon which the thermally insulating bonding pad is disposed during a solder reflow process performed thereon.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications. It is intended that the scope of the invention be defined by the claims appended hereto and their equivalents.

What is claimed is:

1. A thermally insulating bonding pad for solder reflow comprising:
   a structure comprising a first elevated bonding pad that is elevated above and not touching a microactuator; and
   an insulator integrated in said structure, said insulator configured for interposition between said structure and said microactuator to which a first surface of said elevated bonding pad is to be disposed, said insulator for providing thermal insulation of said microactuator during soldering, wherein said insulator is configured for creating a platform support that elevates said elevated bonding pad above said microactuator, and wherein a second surface of said elevated bonding pad is configured to at least partially restrainably touch and support a solder ball in a first position, said second surface being positioned parallel to said first surface and perpendicular to a first surface of a second bonding pad, said first surface of said second bonding pad configured to at least partially restrainably touch and support said solder ball in said first position, said second surface and said first surface of said second bonding pad being flat across their faces such that when said solder ball melts said second surface and said first surface of said second bonding pad become coupled via a melted solder ball.

2. The thermally insulating bonding pad as recited in claim 1 wherein said insulator is comprised substantially of a polyimide.

3. The thermally insulating bonding pad as recited in claim 1 wherein said insulator is configured as a solid structure.

4. The thermally insulating bonding pad as recited in claim 1 wherein said insulator is configured as a hollow structure.

5. The thermally insulating bonding pad as recited in claim 1 wherein said insulator is configured as a combination of solid and hollow structures.

6. The thermally insulating bonding pad of claim 1 wherein said insulator is configured to be coupled to a signal wire present in said microactuator.

7. The thermally insulating bonding pad of claim 1 wherein said first elevated bonding pad is configured to be coupled to a signal wire present in said microactuator.

8. A component having a thermally insulating bonding pad wherein said component is subject to soldering, said component comprising:
   a microactuator;
   an insulator formed onto said microactuator; and
   a first surface of a first elevated bonding pad formed onto said insulator, said insulator interposed between said microactuator and said elevated bonding pad, said elevated bonding pad not touching said microactuator, said insulator for thermally insulating said microactuator from heat during said soldering, wherein said insulator is configured for creating a platform support that elevates said elevated bonding pad above said microactuator, and wherein a second surface of said elevated bonding pad is configured to at least partially restrainably touch and support a solder ball in a first position, said second surface being positioned parallel to said first surface and perpendicular to a first surface of a second bonding pad, said first surface of said second bonding pad configured to at least partially restrainably touch and support said solder ball in said first position, said second surface and said first surface of said second bonding being flat across their faces such that when said solder ball melts said second surface and said first surface of said second bonding pad become coupled via a melted solder ball.

9. The component as recited in claim 8 further comprising:
   a plurality of insulators formed onto said microactuator, wherein said plurality of insulators are located between said microactuator and said first elevated bonding pad providing a stable platform for said first elevated bonding pad.

10. The component as recited in claim 8 wherein said insulator is fabricated substantially of polyimide.

11. The component as recited in claim 8 wherein said insulator is a solid layer.

12. The component as recited in claim 8 wherein said insulator is a solid patterned layer.

13. The component as recited in claim 7 wherein said insulator is a hollow patterned layer.

14. The component as recited in claim 9 wherein said plurality of insulators comprise a first portion and a second portion, said first portion comprising solid structures and said second portion comprising hollow structures.

15. The component as recited in claim 9 wherein said plurality of insulators comprise a first portion and a second portion, said first portion comprising column structures and said second portion comprising wall structures.

16. A method for providing a thermally insulating bonding pad for soldering, said method comprising:

providing a microactuator upon which a first elevated bonding pad is to be disposed, said first elevated bonding pad being elevated above and not touching said microactuator, providing an insulator onto said microactuator; and providing a first surface of said first elevated bonding pad onto said insulator, said insulator for providing thermal insulation to said microactuator during soldering performed on said first elevated bonding pad, said insulator being configured for creating a platform support that elevates said first elevated bonding pad above said microactuator, wherein a second surface of said first elevated bonding pad is configured to partially restrainably touch and support a solder ball in a first position, said second surface being positioned parallel to said first surface and perpendicular to a first surface of a second bonding pad, said first surface of said second bonding pad configured to at least partially restrainably touch and support said solder ball in said first position, said second surface and said first surface of said second bonding pad being flat across their faces and;

melting said solder ball so that said second surface and said first surface of said second bonding pad become coupled via a melted solder ball.

17. The method as recited in claim 16 wherein said providing an insulator further comprises configuring said insulator as a complete layer interposed between said microactuator and said first elevated bonding pad.

18. The method as recited in claim 16 wherein said providing an insulator further comprises configuring said insulator as a plurality of structures interposed between said microactuator and said first elevated bonding pad.

19. The method as recited in claim 16 wherein said providing an insulator further comprises fabricating said insulator from a polyimide.

20. The method as recited in claim 16 wherein said providing an insulator further comprises performing a hollowing thereon during formation of said insulator.

* * * * *

UNITED STATES PATENT AND TRADEMARK OFFICE
CERTIFICATE OF CORRECTION

PATENT NO. : 7,893,534 B2
APPLICATION NO. : 11/891530
DATED : February 22, 2011
INVENTOR(S) : Toshiki Hirano, Haruhide Takahashi and Tatsumi Tsuchiya It is certified that error appears in the above-identified patent and that said Letters Patent is hereby corrected as shown below:

IN THE CLAIMS:

Col. 12, Line 57, Claim 8: Replace "being flat across their faces such that when said solder" and insert -- pad being flat across their faces such that when said solder --

Col. 14, Line 13, Claim 16: Delete "a"

Signed and Sealed this
Seventh Day of August, 2012

David J. Kappos
*Director of the United States Patent and Trademark Office*